United States Patent
Huang

(10) Patent No.: US 6,283,435 B1
(45) Date of Patent: Sep. 4, 2001

(54) STRUCTURE OF A CPU SECURING SEAT

(76) Inventor: Chiang Ming Huang, P.O. Box 82-144, Taipei (TW)

( * ) Notice: Subject to any disclaimer, the term of this patent is extended or adjusted under 35 U.S.C. 154(b) by 0 days.

(21) Appl. No.: 09/496,579

(22) Filed: Feb. 2, 2000

(51) Int. Cl.[7] ................................. A47B 97/00
(52) U.S. Cl. ..................... 248/500; 248/694; 361/764
(58) Field of Search ................... 248/694, 500; 361/764

(56) References Cited

U.S. PATENT DOCUMENTS

| | | | |
|---|---|---|---|
| 5,684,676 | * 11/1997 | Lin | 361/704 |
| 6,014,315 | * 1/2000 | McCullough et al. | 361/704 |
| 6,054,676 | * 4/2000 | Wall et al. | 361/743 X |

* cited by examiner

*Primary Examiner*—Ramon O. Ramirez
(74) *Attorney, Agent, or Firm*—A & J

(57) ABSTRACT

An improved structure of a CPU securing seat comprising a seat body, a covering body and a controlling device, characterized in that the seat body is provided with a plurality of triangular holes, and each of the triangular holes is provided with an inverted V-shaped clipping disc having securing legs extended from the bottom section thereof, the inverted V-shaped clipping disc is extended upward to the pore of the covering seat, and two lateral sides of the top section of the hole are extended to form a protruded rail and the covering body is provided with a plurality of triangular pores and one side of the pore is extended to form a notch, the bottom section of the pore is extended to form an engaging slot; the controlling device is mounted at the top section of the covering body to control the forward and backward movement of the seat body, thereby the controlling device is used to control the covering body to move backward so that the inverted V-shaped clipping disc is clipped by the notch to form an inverted U-shaped to clip the insertion legs of the CPU.

2 Claims, 7 Drawing Sheets

STRUCTURE OF A CPU SECURING SEAT

BACKGROUND OF THE INVENTION a) Technical Field of the Invention

The present invention relates to an improved structure of a CPU securing seat, and in particular, to a CPU securing seat facilitating assemble/dissemble of CPU without deforming the insertion legs of the CPU.

b) Description of the Prior Art

As shown in FIG. 1, a conventional CPU securing seat comprises a seat body 2, a covering body 3, and a pulling rod 4, wherein the seat body 2 is provided with a plurality of holes 20 corresponding to the position of the insertion legs 10 of the CPU 1. At the left side bottom corner, a sloping face 200 is provided so as to form a tapered passage 201. Within the hole 20, a sloping disc 21 is provided and the bottom section of the sloping disc 21 is extended to form a securing leg 210 for mounting and welding onto a mother board 11. On the top side of the seat body 2, an elongated recess 22 extended to the two lateral sides of the seat body 2 is provided for the mounting of the pulling rod 4. The center of the recess 22 has a larger cavity 23 and the bottom section of the two sides of the seat body 2 is provided with a sliding slot 24. At one side of the sliding slot 24, a plurality of notches 25 are provided.

The covering body 3 is mounted onto the top of the seat body 2 and the corresponding positions of the holes 20 are provided with a plurality of circular holes 30 for the insertion of the insertion legs 10 of CPU 1. The front side of the bottom section of the covering body 3 is provided with an engaging block 31, and a lateral disc 32 is extended downwardly from the two sides of the covering block 3 for mounting the covering body 3 at the two sides of the seat body 2. The inner side of the lateral disc 32 is provided with a plurality of protruded blocks 33 for sliding into the sliding slot 24 via the notch 25 of the seat body 2 so that it can move within the sliding slot 24.

The pulling rod 4 is an L-shaped rod body and one side of the rod body is mounted within the elongated recess 22 of the seat body 2 and the rod 4 is bent upward to form an urging section 40 at the corresponding position to the cavity 23. The other side of the rod body is extended out from the seat body 2 and the front end section is bent to form a board-pulling section 41.

Referring to FIGS. 2 and 3, when the pulling rod 4 is moved upward to an upright position, the urging section 40 moves the engaging block 31 of the covering body 3 forward such that the covering body 3 (at the seat body 2) slides forward and the plurality of holes 30 are in alignment with the wider area of the holes 20 of the bottom section of the seat body 2. Thus, the insertion legs 10 of the CPU can be inserted into the holes 30. After that, when the pulling rod 4 is pressed, at this moment, the urging section 40, by means of the engaging block 31 of the backward push of the covering body 3, causes the covering block 3 to slide backward. Thus, the insertion legs 10 of the CPU 1 are driven to move toward the passage 201, and one side of the leg 10 urges the sloping disc 21 to deform and secure to the passage 201.

The conventional CPU securing seat has been widely used but in actual assembling or application, numerous drawbacks are found as follows:

a) Easy deformation of CPU insertion legs, or worn out of insertion legs or sloping disc. In the conventional CPU securing seat, the covering body 3 is moved so as to move the mounted CPU 1 to cause the bottom section of the insertion legs 1 to move to the passage 201 such that one side of the insertion legs 10 urges the sloping disc 21 to deform and they are clipped at the passage 20. Thus, the insertion legs 10 of the CPU 1 will deform as a result of urging with the sloping disc 21. If the insertion legs 10 deform, the CPU 1 cannot be used again. In addition, the mutual urging of the insertion legs 10 may cause the sloping disc 21 to wear out and will not function properly.

b) Inconvenient in operation. In the conventional CPU securing seat, the pulling rod 4 is either pulled up or pushed down so as to move the covering body 3 forward and backward. However, there are numerous electronic components welded on the mother board 11 and are located so close to each others. Using fingers to trigger the pulling rod 4 will interrupt these components, which causes inconvenience in operation. In addition, the wet fingers may contact with these components which cause short circuit.

SUMMARY OF THE INVENTION

Accordingly, it is highly desirable to alleviate the drawbacks of the conventional CPU securing seat structure by provided an improved structure of CPU securing seat.

The main object of the present invention is to provide an improved structure of a CPU securing seat comprising a seat body, a covering body and controlling device, characterized in that the seat body is provided with a plurality of triangular holes, and each of the triangular holes is provided with an inverted V-shaped clipping disc having securing legs extended from the bottom section thereof, the inverted V-shaped clipping disc is extended upward to the pore of the covering seat, and two lateral sides of the top section of the hole are extended to form a protruded rail and the covering body is provided with a plurality of triangular pores and one side of the pore is extended to form a notch, the bottom section of the pore is extended to form an engaging slot; the controlling device is mounted at the top section of the covering body to control the forward and backward movement of the seat body, thereby the controlling device is used to control the covering body to move backward so that the inverted V-shaped clipping disc is clipped by the notch to form an inverted U-shaped to clip the insertion legs of the CPU.

The above objects and other advantages of the present invention will be more apparent by describing in detail preferred embodiment thereof with reference to the drawings in which:

DETAILED DESCRIPTION OF THE PREFERRED EMBODIMENT

Figure 1:
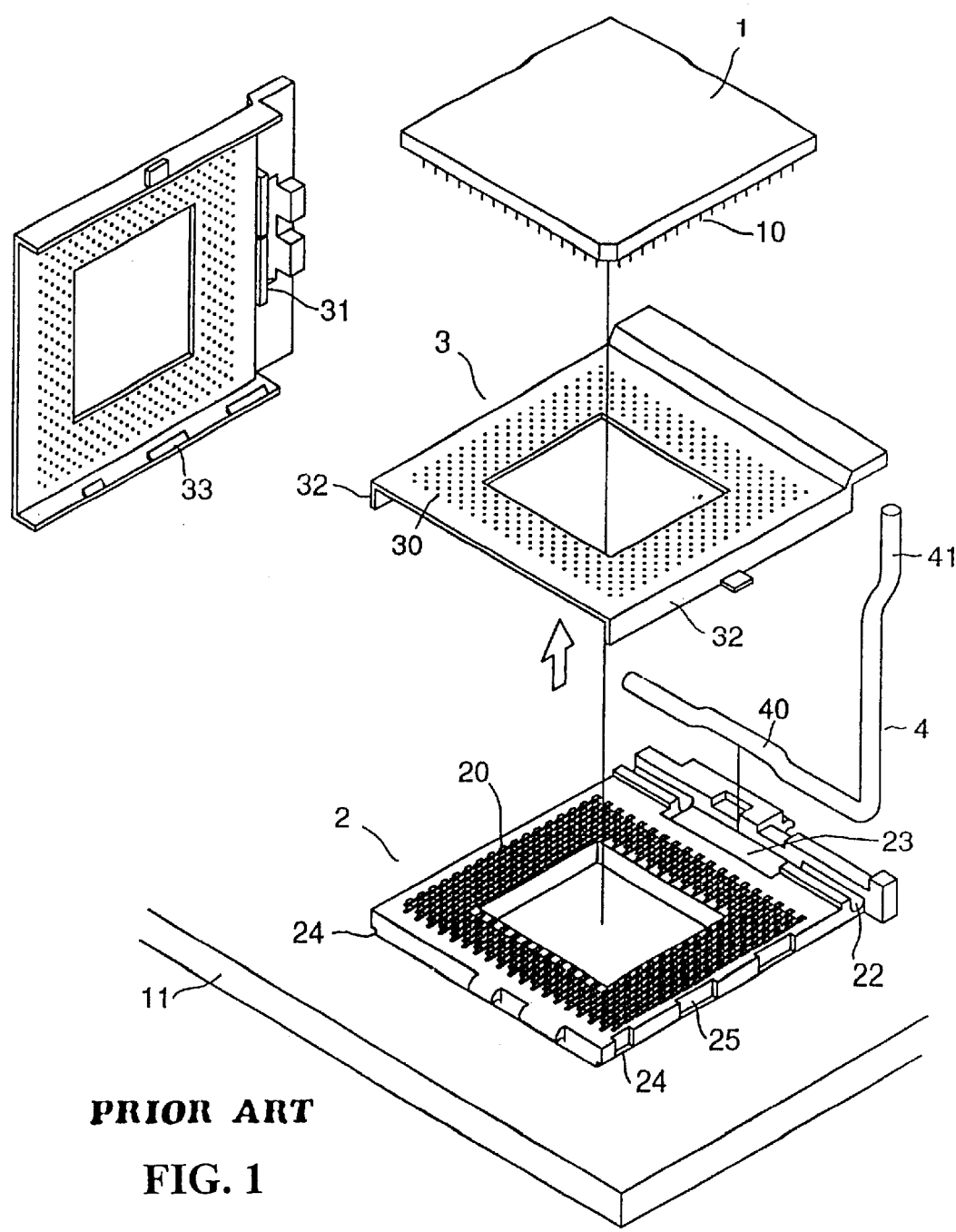
FIG. 1 is a Perspective exploded view of a conventional CPU securing seat.
Figure 2:
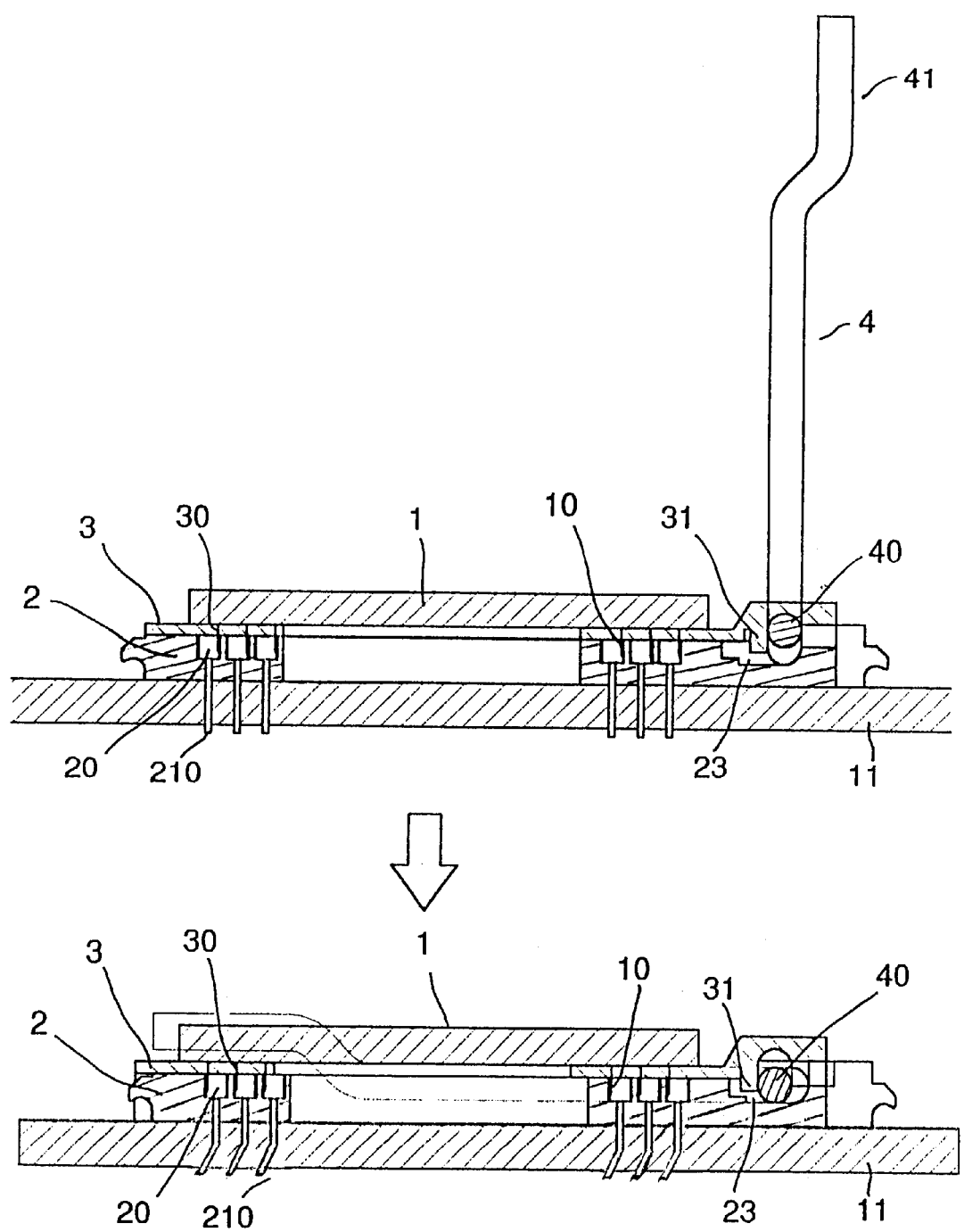
FIG. 2 is a schematic sectional view of a conventional CPU securing seat, showing the downward movement of the board-pulling section.
Figure 3:
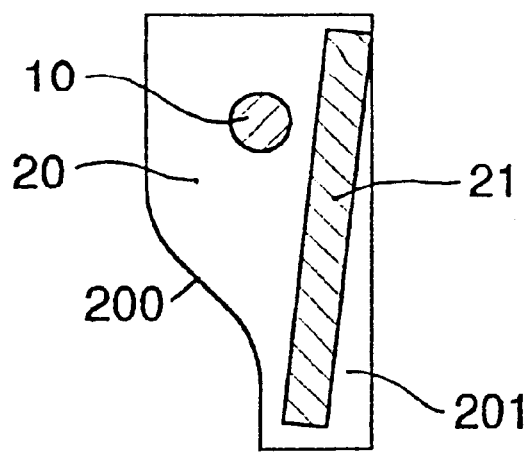
FIG. 3 is a partial schematic view of a conventional CPU securing seat.
Figure 3:
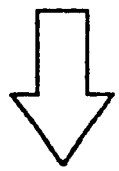
Figure 3:
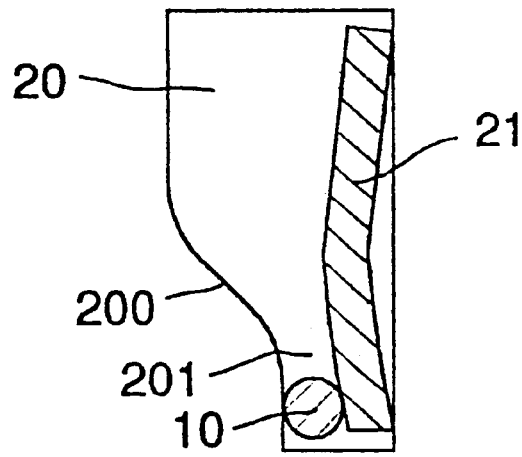
Figure 4:
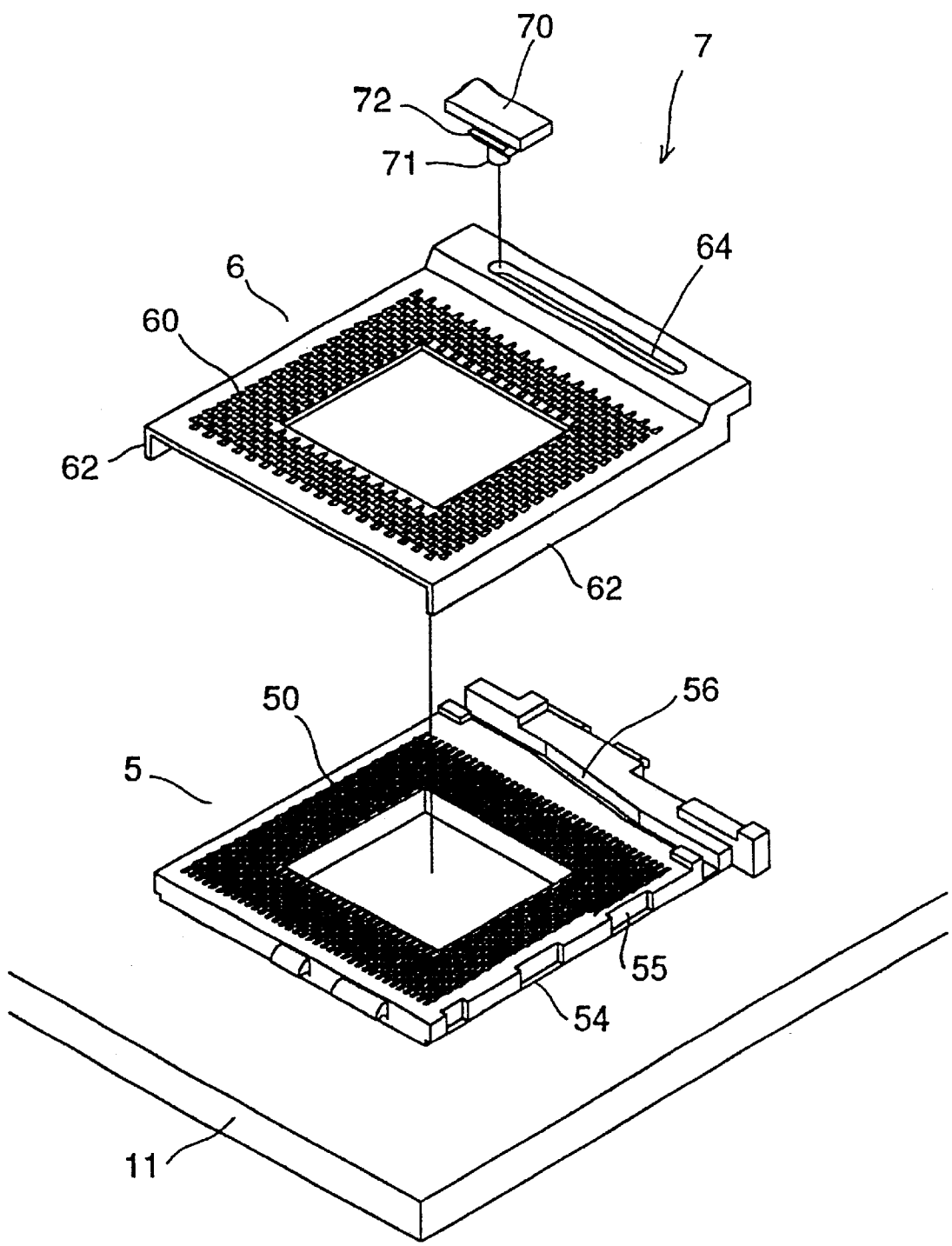
FIG. 4 is a perspective exploded view of the CPU securing seat in accordance with the present invention.
Figure 5:
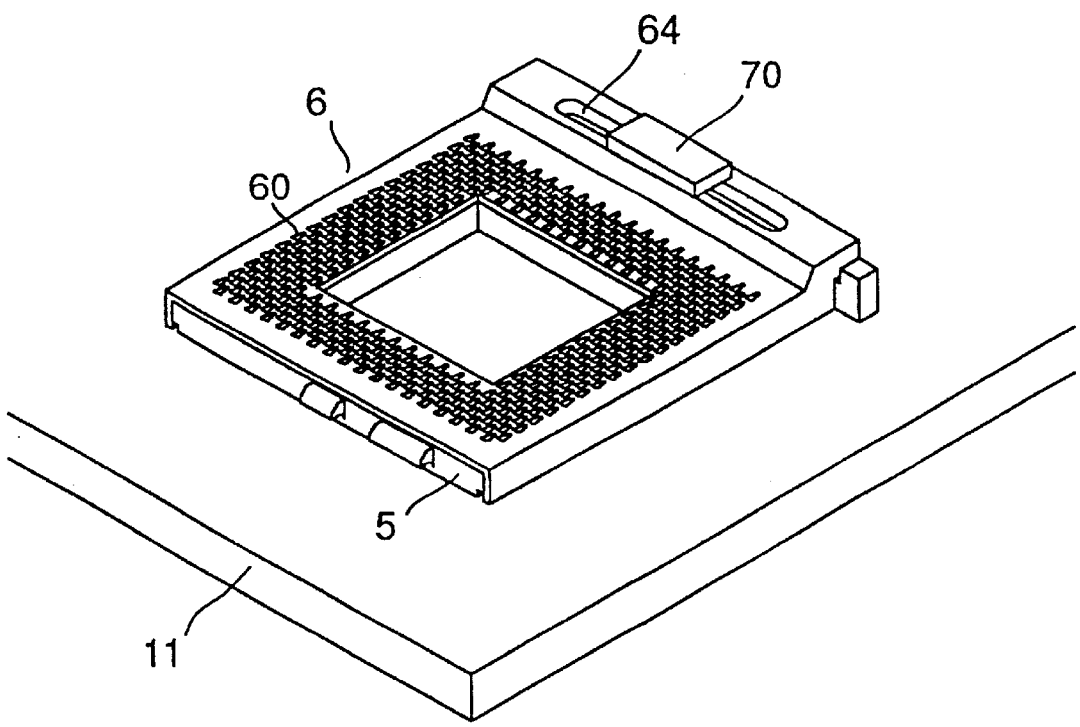
FIG. 5 is a perspective view of the CPU securing seat in accordance with the present invention.

With reference to FIGS. 4 and 5, there is shown an improved structure of a CPU securing seat comprises a seat body 5, a covering body 6, and a controlling device 7. The seat body 5 is provided with a plurality of triangular holes 50 corresponding to the insertion legs 10 of a CPU 1. A V-shaped clipping disc 51 is mounted to the center of the triangular hole 50 therein, and the bottom section of the clipping disc 51 is extended to form a securing leg 52 for welding onto a mother board 11. At each of the two sides of the top section of the triangular hole 50, a protruded rail 53 is provided The two sides of the bottom section of the triangular hole 50 are provided with a sliding slot 54. At one side of the sliding slot 54, there are a plurality of notches 55 thereon.

In accordance with the present invention, the covering body 6 is to be mounted on top of the seat body 5. A plurality of triangular pores 60 are provided at the position corresponding to the triangular holes 50. One lateral side of the pore 60 is extended to form a trough 600. The two lateral sides of the bottom section of the pore 60 are provided with an engaging slot 61. The two lateral sides of the covering body 5 are respectively extended downward to form a lateral disc 62 for mounting onto the two lateral sides of the seat body 5. A plurality of protruded blocks 63 are provided at the inner sides of the lateral disc 62 so that the notch 55 of the seat body 5 can slide into the sliding slot 54 and slidably move within the slot 54.

The controlling device 7 is mounted at the front side of the securing seat. The front side of the seat body 5 is provided with a groove 56 having two parallel ends and a sloping center. The front side of the covering body 6 is provided with a long opening 64, and a pushing block 70 is provided on the long opening 64. The bottom section of the pushing block 70 is provided with a protruded rod 71 which is extended to the groove 56 of the seat body 5. The lower section of the pushing block 70 is provided with two protruded engaging blocks 72 which can be engaged with the long opening 64 without dislocation therefrom.

Figure 6:
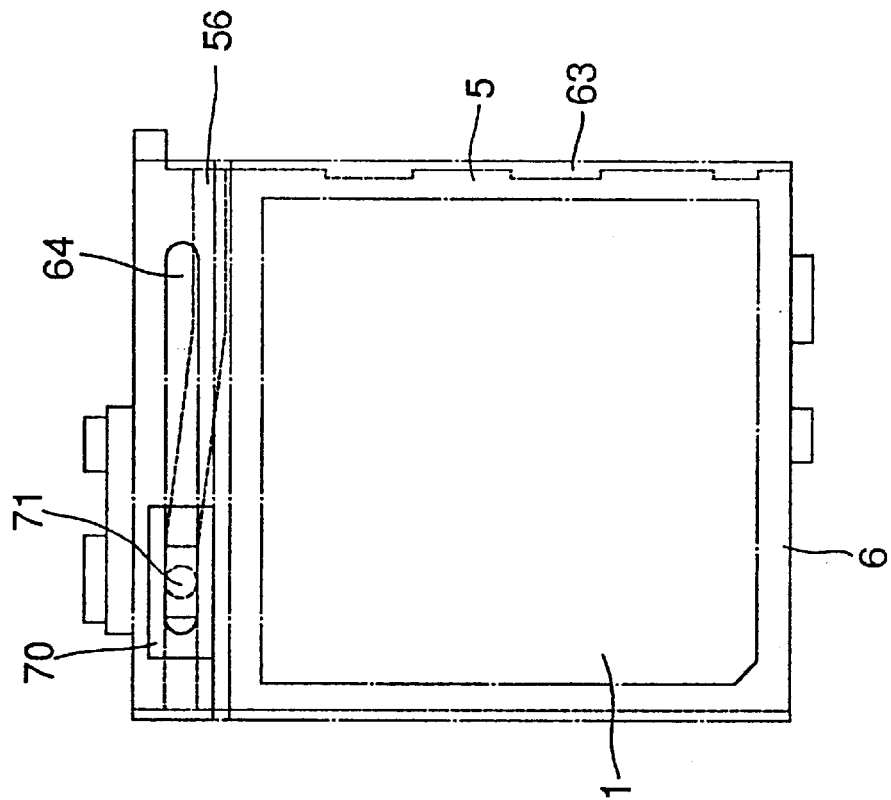
FIG. 6 is a top view of the CPU securing seat, showing the pushing block being pushed.
Figure 6:
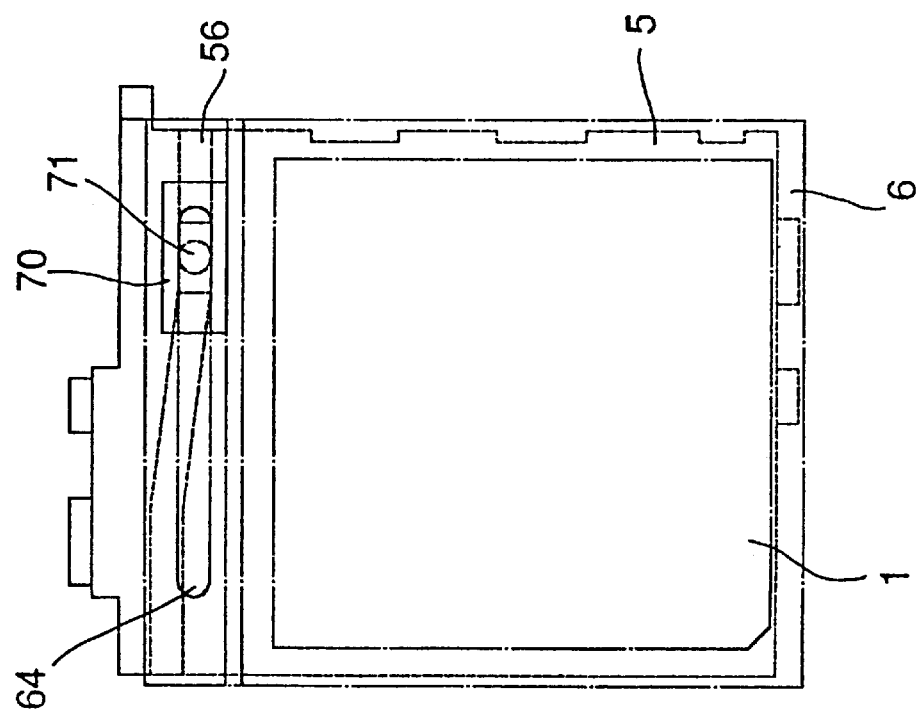
Figure 7:
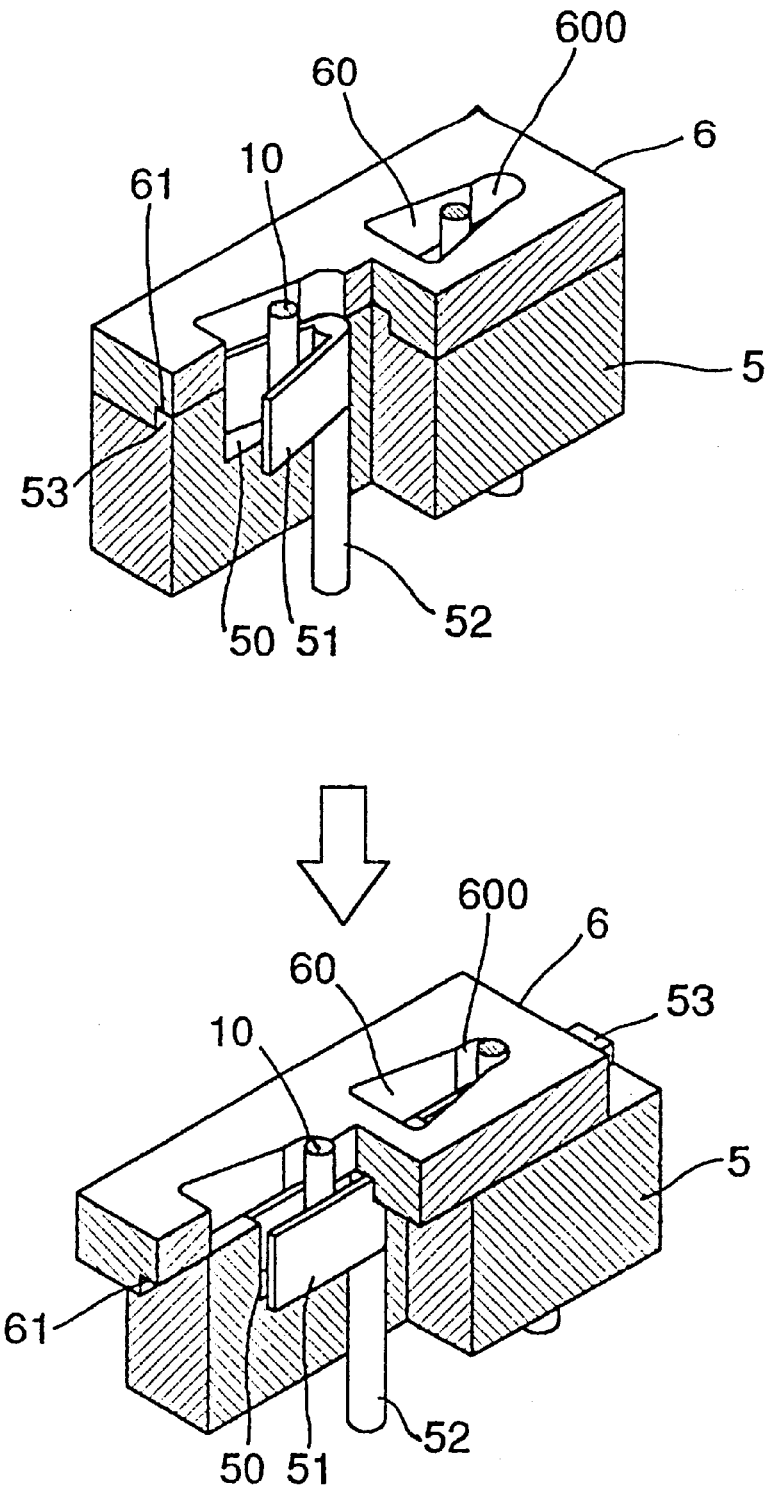
FIG. 7 is a partial perspective view of the CPU securing seat showing the forward movement of the covering body.

Referring to FIGS. 6 and 7, when the pushing block 70 of the controlling device 7 is pushed to the left, the protruded rod 71 at the bottom section thereof will move in the left direction along the groove 56 at the lower section. At the same time, the covering body 6 will also move forward and the plurality of pores 60 are in alignment with the plurality of holes 50 of the bottom section of the seat body 5. In such a way, the insertion legs 10 of the CPU 1 can be inserted into the pores 60. If the pushing block 70 of the controlling device 7 is moved to the right, the protruded rod 71 at the bottom section will move to the right direction along the groove 56 at the lower section. At the same time, the covering body 6 will move backward and the inverted V-shaped clipping disc 51 are urged by the notch 600 forming an inverted U-shape to clip the insertion legs 10 of the CPU 1. Thus, the insertion legs of the CPU 1 are secured.

In accordance with the present invention, the CPU securing seat provides the following advantages:

1) No deformation to the insertion legs of the CPU or no worn-out of the insertion legs or the clipping disc. The present CPU securing seat employs the movement of the covering body 3 to cause the inverted V-shaped clipping disc 51 to engage with the notch 600, and to cause the disc 51 to become an inverted U-shape to clip to the insertion legs 10 of the CPU 1, the insertion legs 10 of the CPU 1 will be secured without deformation or the insertion legs 10 and the clipping will not be damaged or worn-out. The insertion legs 10 can be conveniently used to insert into other securing seat.

2) Conveniently use. As the present invention employs a controlling device 7 to control directly the forward or rearward movement of the covering body 6, the finger of the user will not touch the electronic components located around the CPU 1, and thus the damage or short circuit to the mother board 11 is lowered.

I claim:

1. An improved structure of a CPU securing seat comprising a seat body, a covering body and a controlling device, wherein the seat body is provided with a plurality of triangular holes corresponding to insertion legs of a CPU, and each of the triangular holes is provided with an inverted V-shaped clipping disc mounted to a center of said holes and having securing legs extended from the bottom section thereof, and two lateral sides of the top section of the holes are extended to form a protruded rail, two sides of the bottom section of said holes are provided with a sliding slot, the covering body is provided with a plurality of triangular pores and one side of the pores is extended to form a notch, the bottom section of the pores is extended to form an engaging slot, one side of the sliding slot is provided with a plurality of notches, and the controlling device is mounted at the top section of the covering body to control the forward and backward movement of the seat body, thereby the controlling device is used to control the covering body to move backward so that the inverted V-shaped clipping disc is clipped by the notch to form an inverted U-shape to clip the insertion legs of the CPU.

2. An improved structure of a CPU securing seat comprising a seat body, a covering body and a controlling device, characterized in that the seat body is provided with a plurality of holes, and the covering body is provided with a plurality of pores corresponding to that of the holes, and the controlling device is provided at the front side of the securing seat and the front side of the seat body is provided with a groove having two parallel ends and a sloping center, the front side of the covering body is provided with a long opening and a pushing block is provided on the long opening, the bottom section of the pushing block is provided with a protruded rod which is extended to the groove of the seat body, and the lower section of the pushing block is provided with two protruded engaging blocks which can be engaged with the long opening without dislocation, thereby pushing the pushing block moves the covering body to facilitate the assembling/dissembling of the CPU.

* * * * *